US012620990B2

(12) United States Patent
Opbroek et al.

(10) Patent No.: US 12,620,990 B2
(45) Date of Patent: May 5, 2026

(54) CAPACITOR CIRCUIT AND METHOD FOR CONTROLLING A CAPACITOR CIRCUIT

(71) Applicant: Renesas Design Netherlands B.V., 's-Hertogenbosch (NL)

(72) Inventors: Enno Opbroek, Oss (NL); Shikhar Sinha, Nijmegen (NL)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 176 days.

(21) Appl. No.: 18/494,232

(22) Filed: Oct. 25, 2023

(65) Prior Publication Data

US 2025/0141444 A1 May 1, 2025

(51) Int. Cl.
*H03K 17/687* (2006.01)
*H03K 19/20* (2006.01)

(52) U.S. Cl.
CPC ......... *H03K 17/6871* (2013.01); *H03K 19/20* (2013.01)

(58) Field of Classification Search
CPC ........................... H03K 17/6871; H03K 19/20
See application file for complete search history.

(56) References Cited

U.S. PATENT DOCUMENTS

| | | | |
|---|---|---|---|
| 7,180,383 B2 * | 2/2007 | Angel ................... | H03B 5/1228 331/177 V |
| 2010/0019826 A1 * | 1/2010 | Yeh ..................... | H03B 5/1265 327/337 |

* cited by examiner

*Primary Examiner* — Metasebia T Retebo
(74) *Attorney, Agent, or Firm* — SCULLY, SCOTT, MURPHY & PRESSER, P.C.

(57) ABSTRACT

The present document describes a capacitor circuit (100) which comprises a capacitor element (124) that is arranged between an intermediate node (122) and a reference potential (111), and a switching element (121) which comprises a first terminal that is coupled to the intermediate node (122) and a second terminal that is coupled to the reference potential (111) during the ON state of the switching element (121). Furthermore, the capacitor circuit (100) comprises a control unit (110, 210) which is configured to cause a transition from the ON state to the OFF state of the switching element (121) at a switching time instant; and, within a bias interval that is prior to the switching time instant, to transfer an electrical charge to the intermediate node (122), which is adapted to at least partially compensate an electrical charge that is transferred to the intermediated node (122) during the transition from the ON state to the OFF state of the switching element (121).

15 Claims, 6 Drawing Sheets

300

| |
|---|
| determining that the capacitance of the capacitor circuit is to be modified |

301

| |
|---|
| transferring charge to the intermediate node prior to switching the switching element to the OFF state |

302

| |
|---|
| switching the switching element to the OFF state, to modify the capacitance |

303

CAPACITOR CIRCUIT AND METHOD FOR CONTROLLING A CAPACITOR CIRCUIT

TECHNICAL FIELD

The present document relates to a capacitor circuit with a variable capacitance. Furthermore, the present document relates to a corresponding method for controlling a capacitor circuit for modifying the capacitance.

BACKGROUND

A transmission unit such as a Bluetooth Low Energy (BLE) transmitter typically comprises a modulation circuit which is configured to generate a modulator signal for modulating a carrier signal. The modulation circuit may be configured to adapt the frequency of the modulator signal. Adapting the frequency of the modulator signal may be achieved by adapting the resonance frequency of an LC circuit, wherein the LC circuit comprises a capacitor circuit with a variable capacitance.

The present document addresses the technical problem of adapting the capacitance of a capacitor circuit in a precise and stable manner, in particular for enabling a precise and stable modulation of a carrier signal of a radio transmission unit. The technical problem is solved by the independent claims. Preferred examples are described in the dependent claims.

SUMMARY

According to an aspect, a capacitor circuit is described, which comprises a capacitor element that is arranged between an intermediate node and a reference potential, and a switching element which comprises a first terminal that is coupled to the intermediate node and a second terminal that is coupled to the reference potential during the ON state of the switching element. The switching element is configured to be switched between the ON state and the Off state, wherein the switching element exhibits an on-resistance between the first terminal and the second terminal during the ON state and an off-resistance between the first terminal and the second terminal during the OFF state.

The capacitor circuit further comprises a control unit which is configured to cause a transition from the ON state to the OFF state of the switching element at a switching time instant. The control unit is further configured, within a bias interval that is prior to the switching time instant, to transfer an electrical charge to the intermediate node, which is adapted to at least partially or fully compensate an electrical charge that is transferred (from the switching element) to the intermediated node during the transition from the ON state to the OFF state of the switching element.

According to a further aspect, a method for controlling a capacitor circuit is described. The method comprises determining that the capacitance of the capacitor circuit is to be modified. Furthermore, the method comprises, in reaction to the determining, transferring an electrical charge to the intermediate node, which is adapted to at least partially or fully compensate an electrical charge that is transferred (from the switching element) to the intermediated node during the transition from the ON state to the OFF state of the switching element. In addition, the method comprises, subsequent to transferring the electrical charge, causing the transition from the ON state to the OFF state of the switching element, to modify the capacitance of the capacitor circuit.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

SHORT DESCRIPTION OF THE FIGURES

The invention is explained below in an exemplary manner with reference to the accompanying drawings, wherein FIG. 1a illustrates an example capacitor circuit;

FIG. 1b shows the ON state of the capacitor circuit of FIG. 1a;

FIG. 1c shows the OFF state of the capacitor circuit of FIG. 1a;

FIG. 2b shows the evolution of the voltage at the intermediate node for the capacitor circuit of FIG. 2a; and FIG. 3 shows a flow chart of an example method for adapting the capacitance of a capacitor circuit.

DETAILED DESCRIPTION

Figure 1A:
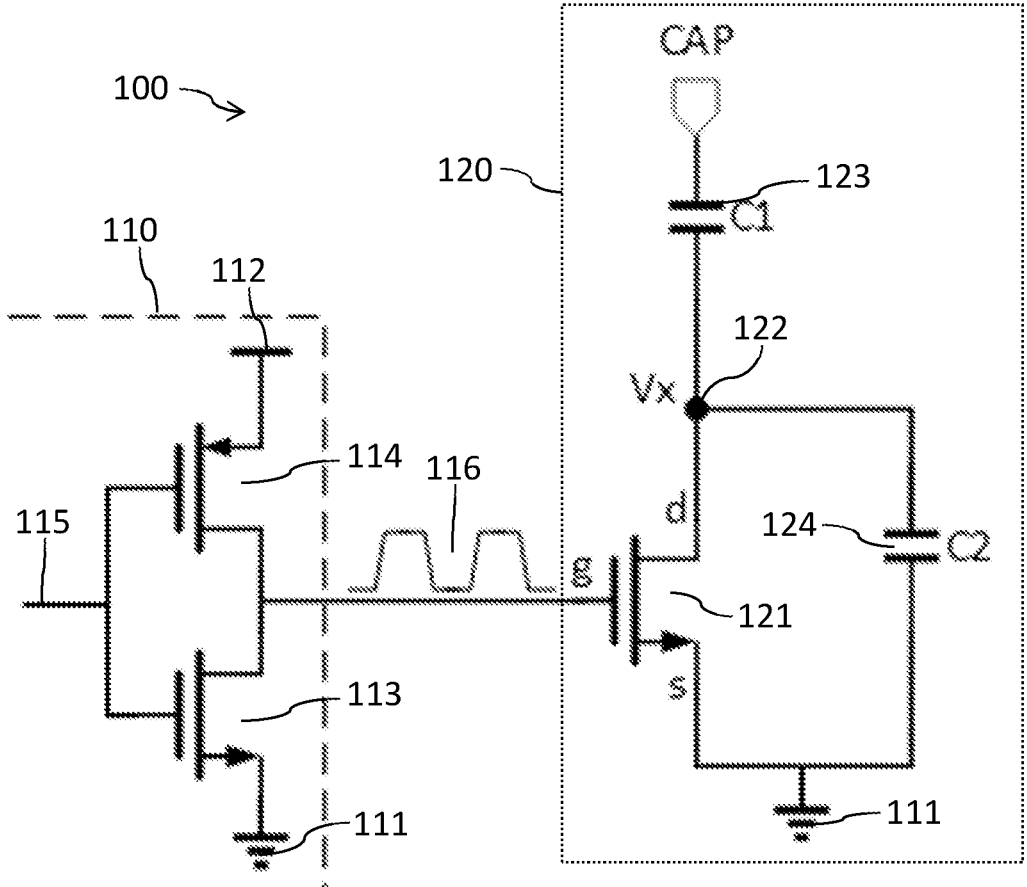

As indicated above, the present document is directed at enabling a precise and stable switching between different capacitance values of a capacitor circuit. In this context, FIG. 1a shows an example capacitor circuit 100 which comprises a drive unit 110 for driving a switching element 121 of a capacitor unit 120. The switching element 121 may be a metaloxide semiconductor (MOS) field effect transistor (FET), in particular an n-type MOS transistor, as shown in FIG. 1a. The drive unit 110 may be configured to generate a drive signal 116 (for controlling the switching element 121) in dependence of a digital control signal 115.

The drive signal 116 may take on a low state (which corresponds e.g., to a reference potential 111 such as ground) for switching off the switching element 121. The low state of the drive signal 116 may be generated by closing the low side switch 113 of the drive unit 110. Furthermore, the drive signal 116 may take on a high state (which corresponds e.g., to a drive potential 112 such as the drive voltage vdd) for switching on the switching element 121. The high state of the drive signal 116 may be generated by closing the high side switch 114 of the driver unit 110.

The capacitor unit 120 comprises a first capacitor 123 (with a first capacitance C1) and a second capacitor 124 (with a second capacitance C2). The capacitors 123, 124 may be referred to in more general terms as capacitor elements. A first terminal of the first capacitor 123 may be (directly) coupled to a capacitor node CAP, and the second terminal of the first capacitor 123 may be (directly) coupled to an intermediate node 122. The first terminal of the second capacitor 124 may be (directly) coupled to the intermediate node 122, and the second terminal of the second capacitor 124 may be (directly) coupled to the reference potential 111.

The switching element 121 of the capacitor unit 120 may be arranged in parallel with the second capacitor 124, such that the first terminal (e.g., the drain) of the switching element 121 is (directly) coupled to the intermediate node 122 and such that the second terminal (e.g., the source) of the switching element 121 is (directly) coupled to the reference potential 111.

Figure 1B:
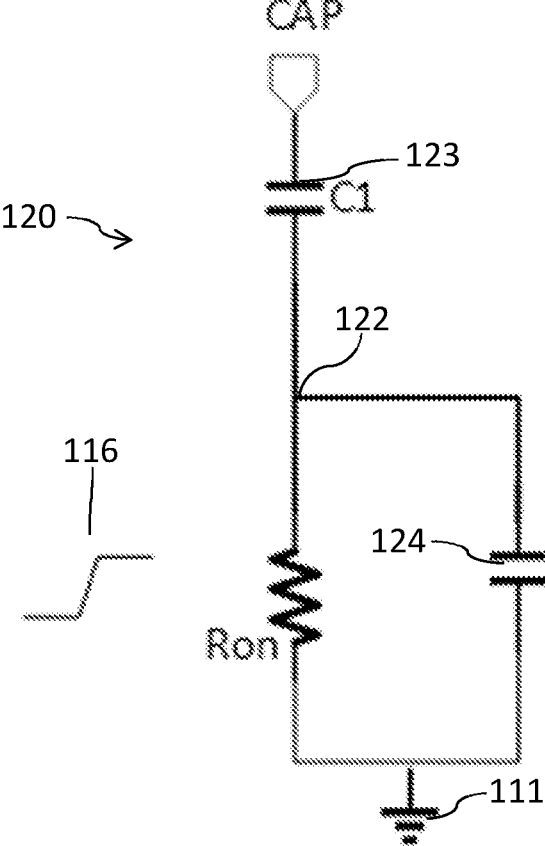
Figure 1C:
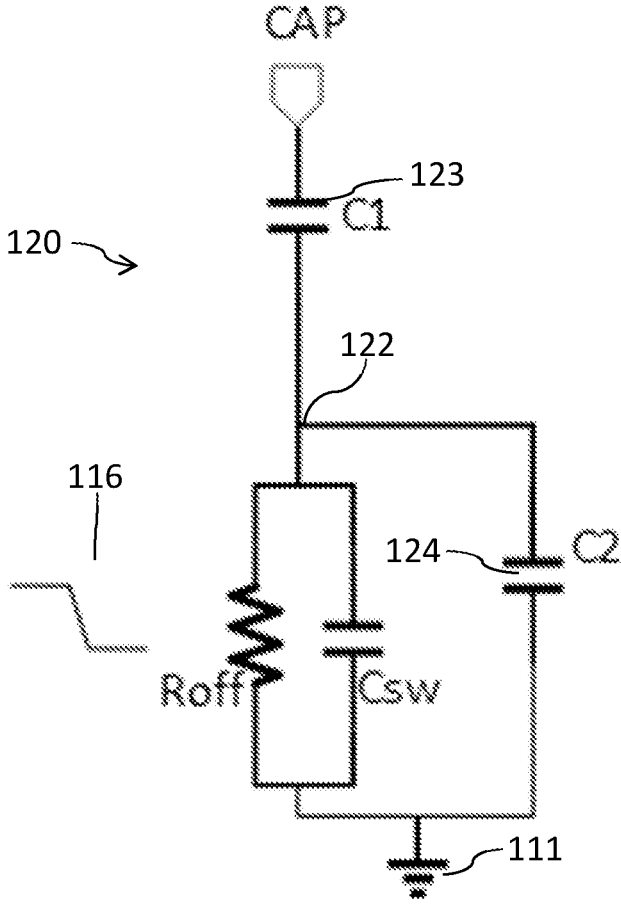

The effective capacitance of the capacitor unit 120 may be changed by switching on or off the switching element 121. FIG. 1b shows the capacitor unit 120 with the switching element 121 being in ON state, such that the switching element 121 may be represented by its (relatively low) on-resistance Ron. FIG. 1c shows the capacitor unit 120 with the switching element 121 being in OFF state, such that the switching element 121 may be represented by a parallel arrangement of a (relatively high) off-resistance Roff and a switch-capacitance Csw.

Hence, for dynamically changing the capacitance at the capacitor node CAP, a switching element 121 may be used to connect and disconnect one or more capacitors 124 (e.g., with capacitance C2). As shown in FIG. 1a, for changing the capacitance at the capacitor node CAP, the capacitor element 124 (with the capacitance C2) can be dynamically switched ON and OFF using an nMOS switching element 121. In case of an ideal switching, a capacitance C1 is provided in the ON state and a capacitance "C1 in series with C2" is provided in the OFF state of the switching element 121.

For circuits 100 which are used in mobile devices, a low power consumption and a small die area are typically key-design parameters. For this purpose, the sizes (i.e., the capacitance values) of the capacitor elements 123, 124 may be reduced, thereby reducing the area and the required current for charging and discharging one or more capacitor elements 123, 124 (notably C2). By way of example, the capacitances C1, C2 may be in the range of attofarad, e.g., 100 attofarad or less.

When using small capacitances, the total capacitance which is seen at the intermediate node 122 Vx is also small, and the parasitic parameters (Ron, Roff, Csw) of the switching element 121 become more relevant and may contribute to a non-ideal behavior of the capacitor circuit 100.

The extent of voltage change at the intermediate node 122 Vx, depends on the size of the capacitors 123, 124 and the amount of charge that is injected into the intermediate node 122 due to the switching element 121 (when the switching element 121 transitions from ON state to OFF state). If the injected charge is small compared to the charge that is stored in the capacitor elements 123, 124, the voltage change at the intermediate node 122 will be relatively small. The voltage change at the intermediate node 122 Vx may be calculated using the formula for the capacitance of two capacitors in parallel:

$$Ceq = C1 + C2,$$

where Ceq is the equivalent capacitance seen at the intermediate node 122 Vx.

The voltage change may be calculated as $\Delta Vx = Qinj/Ceq$, where Qinj is the injected charge due to the switching element 121 which goes from ON state to OFF state.

Hence, when a charge Qinj is injected at the intermediate node 122 Vx (due to the transition from ON state to OFF state of the switching element 121), the voltage at that intermediate node 122 will change by an amount that depends on the capacitance of the capacitor elements 123, 124 and the amount of injected charge. If the node capacitance Ceq at the intermediate node 122 Vx is relatively small compared to the gate-drain capacitance Cgd of the switching element 121 (which provides the injected charge Qinj), a significant voltage change may occur at the intermediate node 122.

In the ON state of the switching element 121, the intermediate node 122 Vx is shorted to the reference potential 111 (see FIG. 1b), and in the OFF state of the switching element 121, the intermediate node 122 is floating (see FIG. 1c). If a non-ideal switching element 121 is considered, the switching element 121 can be replaced by a resistor of value Ron and Roff in the ON and OFF state, respectively. Preferably, Ron is low enough and Roff is high enough, so that the switching element 121 can be considered as an ideal switch.

Figure 1D:
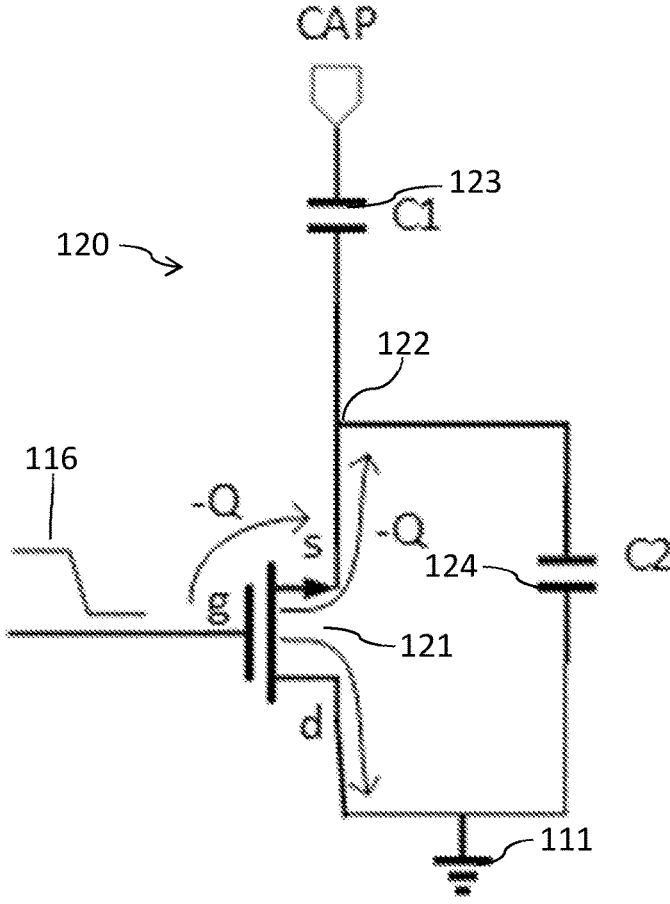
FIG. 1d illustrates the charge transfer to the intermediate node during transition from ON state to OFF state of the capacitor circuit.

As illustrated in FIG. 1d, when the switching element 121 is going from ON state to OFF state, i.e., when the nMOS gate voltage (i.e., the drive signal) 116 is going from high to low, the floating intermediate node 122 Vx acquires a negative charge-Q due to.

the charge displacement from the nMOS channel of the switching element 121; and/or the voltage transition in the gate-drain capacitance of the nMOS switching element 121.

Figure 1E:
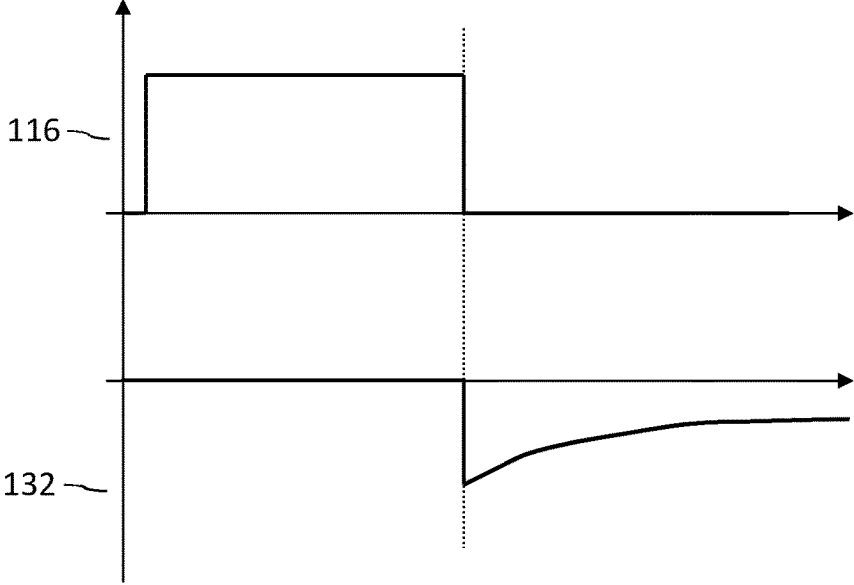
FIG. 1e shows the evolution of the voltage at the intermediate node of the capacitor circuit during and after the transition to the OFF state.

The voltage 132 at the intermediate node 122 Vx may be at approximately 0V during the ON state, and an addition of a negative charge-Q results in a negative voltage 132 at the intermediate node 122 (see FIG. 1e). This negative potential at the intermediate node 122 Vx reduces the value of the off-resistance Roff, thereby affecting the ideal change in capacitance values of the capacitor circuit 100 during dynamic switching.

As the intermediate node 122 Vx has a lower (negative) potential compared to the source of the switching element 121 (which is at ground level), the drain and the source flip (as illustrated in FIG. 1d), thereby making the gate-source voltage Vgs positive which results in a relatively low off-resistance Roff in the OFF state of the switching element 121.

As a result of the relatively low off-resistance Roff of the switching element 121, the negative charge at the intermediate node 122 will leak to ground during the OFF state of the switching element 121, which results in a gradually decreasing capacitive load during the OFF state (as illustrated by the gradually increasing voltage 132 at the intermediate node 122 in FIG. 1e).

The gradually decreasing capacitive load leads to a gradually changing effective capacitance at the capacitor node CAP, which results in a corresponding frequency drift of a DCO (Digitally Controlled Oscillator) that makes use of the capacitor circuit 100.

In the present document, a capacitor circuit 100 is described which does not exhibit a gradual change in capacitance over time. The capacitor circuit 100 is configured to pre-charge the intermediate node 122 prior to switching off the switching element 121, thereby preventing the intermediate node 122 to drop to a voltage 132 which is below the reference potential 111 (notably which is negative). As a result of this, the gate-source voltage Vgs is negative during the (complete) OFF state of the switching element 121 such that the switching element 121 exhibits a relatively high off-resistance Roff and such that a charge leakage to the reference potential 111 may be avoided, or at least reduced, during the OFF state. This leads to a stable capacitance of the capacitor unit 120 during the OFF state of the switching element 121.

Figure 2A:
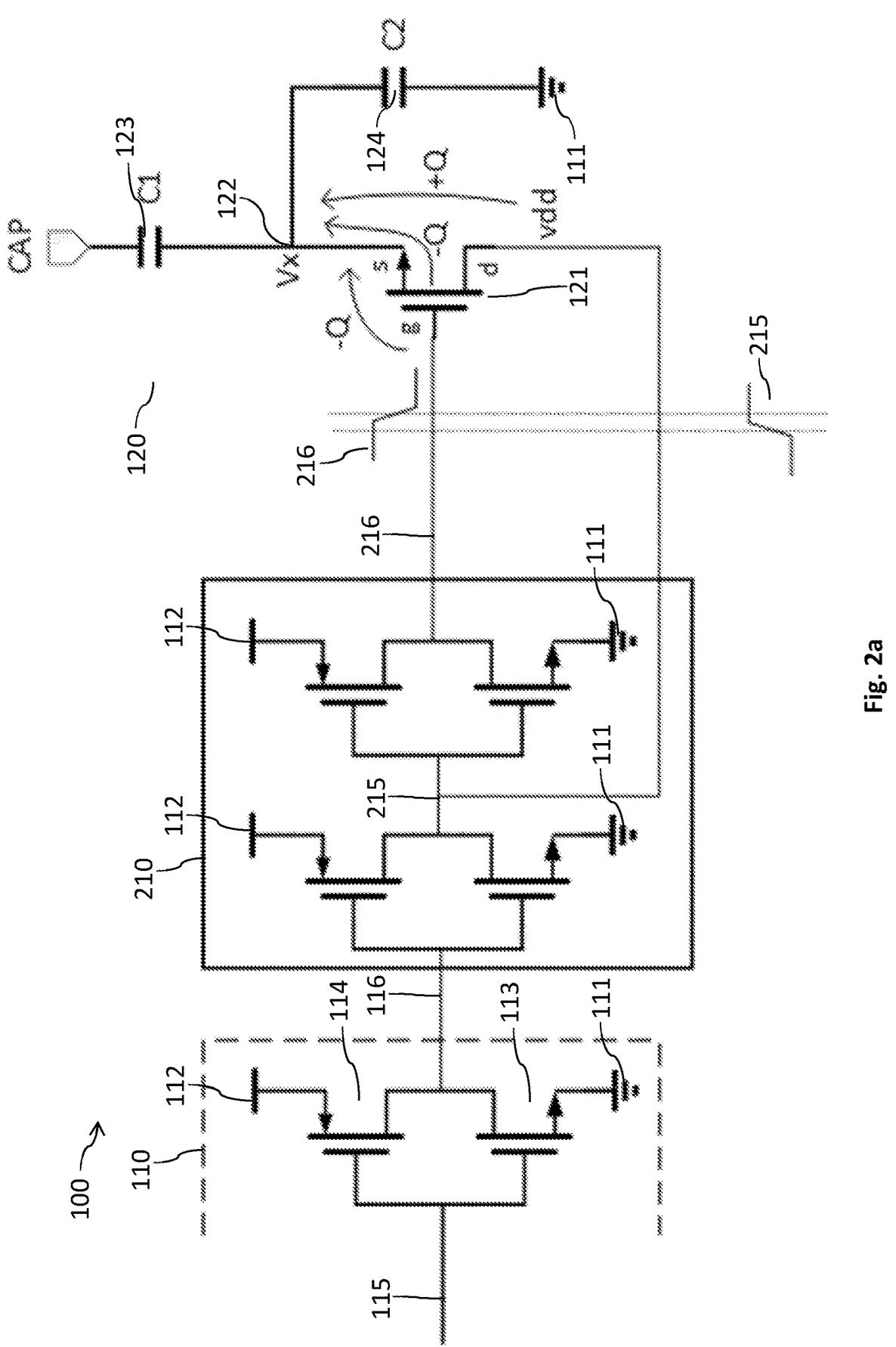
FIG. 2a shows an example capacitor circuit with an inverter unit.

The capacitor circuit 100 may comprise in inverter unit 210 as shown in FIG. 2*a*, which is configured to pull up the second terminal of the switching element 121 to the drive potential 112 during the ON state of the switching element 121, immediately prior to the transition from the ON state to the OFF state. The inverter unit 210 may comprise a first inverter which is configured to invert the drive signal 116, thereby providing an inverted drive signal 215. Using a second inverter, the inverted drive signal 215 may be inverted once again, to provide an effective drive signal 216. The inverted drive signal 215 is low, when the effective drive signal 216 is high, and the inverted drive signal 215 is high, when the effective drive signal 216 is low. However, due to an inherent delay, the transition of the effective drive signal 216 from high to low occurs in a delayed manner with regards to the corresponding transition of the inverted drive signal 215 from low to high.

The transition from the ON state to the OFF state of the switching element 121 is controlled by the effective drive signal 216 (going from high to low). Directly prior to the transition from the ON state to the OFF state, the inverted drive signal 215 goes from low to high (i.e., from the reference potential 111 to the drive potential 112), thereby moving the second terminal of the switching element 121 from the reference potential 111 to the drive potential 112. As the switching element 121 is still in ON state, the intermediate node 122 (which is coupled to the first terminal of the switching element 121) is pulled up to the drive potential 112.

Subsequent to the pre-determined delay, the effective drive signal 216 goes from high (the drive potential 112) to low (the reference potential 111), and as a result of this, the switching element 121 goes from the ON state to the OFF state. The voltage between the control terminal (e.g., the gate) of the switching element 121 and the first and/or second terminal (e.g., the drain and/or the source) of the switching element 121 is negative during the entire OFF state of the switching element 121, thereby maintaining a relatively high off-resistance of the switching element 121 and thereby preventing charge leakage (as illustrated by the stable voltage 132 shown in FIG. 2*b*).

Hence, an improved method for charging and discharging a capacitor 124 using a switching element 121 is described. The method enables the use of relatively small capacitor elements 123, 124 (for reducing the die area and for increasing the power efficiency), while maintaining a relatively high robustness with regards to parasitic parameters and other circuit variances. The method makes use of a pre-biasing step for biasing the intermediate node 122 of the capacitor unit 120 (i.e., the first terminal of the switching element 121). This allows increasing the accuracy of the capacitance value of the capacitor unit 120, while making use of relatively small capacitor elements 123, 124.

In particular, the voltage 132 of the intermediate node 122 Vx in increased to a value that is higher than the reference potential 111, before the switching element 121 is turned off, such that the Vgs of the switching element 121 is negative and reliably and strongly maintains the switching element 121 in the OFF state, such that the charge leakage from the intermediate node 122 Vx is negligible.

This may be achieved by making the source of the nMOS switching element 121 go high just before the gate of the nMOS switching element 121 goes low, as illustrated in FIG. 2*a*. Using the inherent delay between the input and the output of the last inverter of the inverter unit 210, the intermediate node 122 can be charged to a potential above zero before the gate of the nMOS switching element 121 goes low. The delay can be adjusted, by adjusting the ratio of the drive strength of the pMOS (i.e., the high side switch) and nMOS (i.e., the low side switch) of the last inverter of the inverter unit 210. By adjusting the delay, the potential of the intermediate node 122 Vx may be adjusted, in particular to a potential which, when added to the negative charge-Q of the high to low transition of the gate of the switching element 121, results in a target voltage level at the intermediate node 122 Vx that is sufficient for maintain the switching element 121 in the OFF state in a reliable manner.

It should be noted that the switching scheme which is described in the present document can be applied to a pMOS switching element 121 in an analogous manner.

Figures 2B, 3:
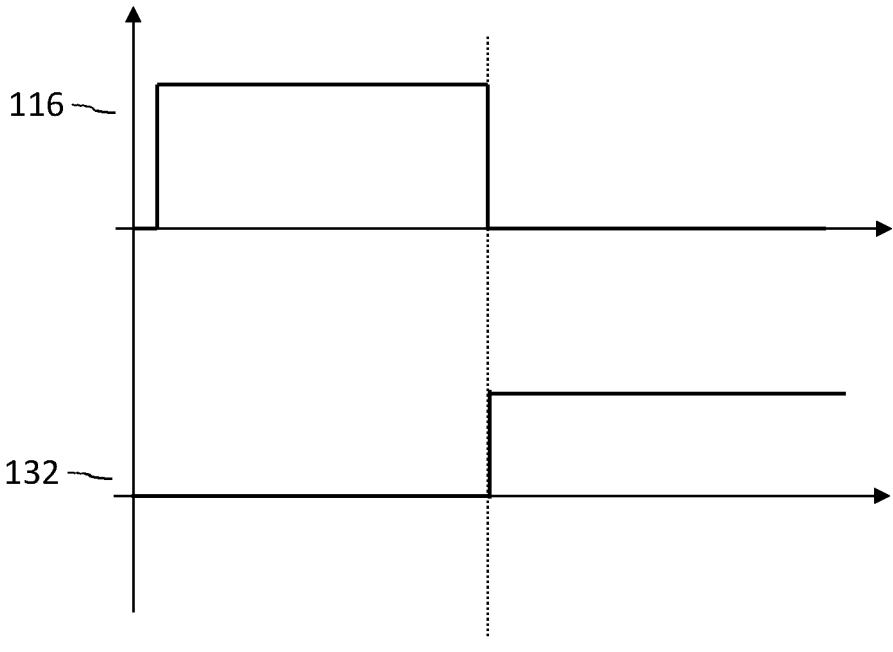

FIG. 3 shows a flow chart of an example method 300 for controlling a capacitor circuit 100, wherein the capacitor circuit 100 may exhibit a capacitance which is modifiable by switching on or off the switching element 121 of the capacitor circuit 100. In particular, the capacitor circuit 100 may exhibit an ON-state capacitance, when the switching element 121 is in the ON state, and an OFF-state capacitance, when the switching element 121 is in the OFF state.

The capacitor circuit 100 comprises a capacitor element 124 (with capacitance C2) that is arranged (directly) between the intermediate node 122 and the reference potential 111 (which may be ground). The intermediate node 122 may be coupled to a capacitor node CAP of the capacitor circuit 100 via a further capacitor 123 (with capacitance C1).

Furthermore, the capacitor circuit 100 comprises a switching element 121 (notably a MOS transistor) which comprises a first terminal that is (directly) coupled to the intermediate node 122 and a second terminal that is coupled to the reference potential 111 during the ON state of the switching element 121 (e.g., via one or more closed switches of an inverter of the inverter unit 210). The switching element 121 is configured to be switched between the ON state (to provide the ON-state capacitance) and the OFF state (to provide the OFF-state capacitance). The switching element 121 typically exhibits an on-resistance between the first terminal and the second terminal (which is preferably substantially zero) during the ON state, and an off-resistance between the first terminal and the second terminal (which is preferably high) during the OFF state, wherein the off-resistance is (substantially, e.g., by 5 orders of magnitude or more) higher than the on-resistance.

The method 300 comprises determining 301 that the capacitance of the capacitor circuit 100 is to be modified. In particular, it may be determined that the capacitance is to be switched from the ON-state capacitance to the OFF-state capacitance. This may be determined, e.g., because the frequency of an oscillator circuit (which comprises the capacitor circuit) is to be changed.

The method 300 further comprises, in reaction to the determining 301, transferring 302 an electrical charge (notably a positive charge) to the intermediate node 122, wherein the charge is adapted to at least partially or fully compensate an electrical charge (notably a negative charge) that is transferred (from the switching element 121) to the inter-mediated node 122 during a transition from the ON state to the OFF state of the switching element 121. The (positive) electrical charge which is transferred 302 prior to the transition from the ON state to the OFF state may be equal to or higher than the (negative) electrical charge which is injected to the intermediated node 122 during the directly following transition from the ON state to the OFF state of the switching element 121. The electrical charge may be transferred via the switching element 121 (e.g., from the second terminal to the first terminal), wherein the switching element 121 is in ON state.

The (positive) electrical charge may be transferred by increasing the voltage 132 of the intermediate node 122 prior to the transition from the ON state to the OFF state. For this purpose, the second terminal of the switching element 121 may be coupled to the drive potential 112 (prior to the transition of the switching element 121 from the ON state to the OFF state).

Furthermore, the method 300 comprises subsequent to transferring 302 the electrical charge, causing 303 the transition from the ON state to the OFF state of the switching element 121, to modify the capacitance of the capacitor circuit 100 (to the OFF-state capacitance).

By transferring an electrical charge to the intermediate node 122 prior to a subsequent transition from the ON state to the OFF state, a particularly stable OFF-state capacitance may be provided (even when using relatively small capacitor elements 123, 124).

Hence, a capacitor circuit 100 is described, which comprises a capacitor element 124 that is arranged between the intermediate node 122 and the reference potential 111. Furthermore, the capacitor circuit 100 comprises a switching element 121 which comprises a first terminal that is coupled to the intermediate node 122 and a second terminal that is coupled to the reference potential 111 during the ON state of the switching element 121.

The capacitor circuit 100 typically comprises a further capacitor element 123 that is arranged between the capacitor node CAP of the capacitor circuit 100 and the intermediate node 122. The capacitor circuit 100 may be configured to provide the ON-state capacitance at the capacitor node CAP during the ON state of the switching element 121, and the OFF-state capacitance during the OFF state of the switching element 121.

The switching element 121 may be a MOS transistor, in particular an n-type or p-type MOS transistor. The first terminal and the second terminal of the switching element 121 may correspond to a source and a drain of the MOS transistor. The first terminal may be the source or the drain, and the second terminal may be the other one of the source or the drain. The control terminal of the switching element 121 may correspond to the gate of the MOS transistor.

Furthermore, the capacitor circuit 100 comprises a control unit 110, 210 which is configured to cause a transition from the ON state to the OFF state of the switching element 121 at a switching time instant. By way of example, a (digital) control signal 115 may indicate that the transition from the ON state to the OFF state of the switching element 121 is to be performed. In reaction to this, the control unit 110, 210 may cause the transition from the ON state to the OFF state using a drive unit 110 which is configured to generate a drive signal 116, 216 that is applied to the control terminal of the switching element 121.

In particular, the control unit 110, 210 may be configured to determine that the capacitance of the capacitor circuit 100 is to be modified (which may be indicated by the digital control signal 115). In reaction to determining that the capacitance of the capacitor circuit 100 is to be modified, the switching element 121 may be caused to transition from the ON state to the OFF state.

The control unit 110, 210 is further configured, within a bias interval that is prior to the switching time instant, to transfer an electrical charge to the intermediate node 122, wherein the electrical charge is adapted to at least partially or fully compensate, in particular cancel, the electrical charge that is transferred (from the switching element 121) to the intermediated node 122 during the transition from the ON state to the OFF state of the switching element 121.

Hence, the control unit 110, 210 may be configured to automatically perform a transfer of electrical charge to the intermediate node 122 immediately prior to the transition of the switching element 121 from the ON state to the OFF state. The transfer of electrical charge is performed within a bias interval, wherein the bias interval typically has a pre-determined, limited duration.

The bias interval preferably immediately precedes the switching time instant. The transition of the switching element 121 from the ON state to the OFF state may be accomplished within a certain transition time. The bias interval may have a total duration that is relatively short, e.g., two times the transition time or less.

The duration of the bias interval may be sufficiently long to ensure that the electrical charge that is transferred (e.g., from the second terminal to the first terminal) to the intermediate node 122 prior to the transition from ON state to OFF state is equal to or higher than the electrical charge that is injected from the switching element 121 to the intermediate node 122 during the transition from the ON state to the OFF state.

By performing the transfer of electrical charge during the bias interval, it may be ensured that the switching element 121 is transitioned to and maintained in the OFF state in a stable manner and with a particularly high off-resistance. As a result of this, charge leakage from the intermediate node 122 to the second terminal of the switching element 121 may be reduced, such that the OFF-state capacitance may be maintained at a (substantially) constant value during the entire OFF state of the switching element 121.

The control unit 110, 210 is typically configured, at the switching time instant, to transfer the control terminal of the switching element 121 from the drive potential 112 to the reference potential 111, to cause the transition from the ON state to the OFF state of the switching element 121. The drive potential 112 may be higher than the reference potential 111.

The control unit 110, 210 may be configured, within the bias interval prior to the switching time instant, to charge the intermediate node 122 to a voltage level that lies between the reference potential 111 and the drive potential 112 or that is equal to the drive potential 112. In particular, the control unit 110, 120 may be configured, within the bias interval prior to the switching time instant, to increase the voltage 132 at the intermediate node 122 to a voltage level which is higher than the reference potential 111, and which is at or below the drive potential 112.

By doing this, the charge transfer to the intermediate node 122 may be performed in a particularly efficient and reliable manner.

The control unit 110, 210 may be configured, within the bias interval prior to the switching time instant, to transfer the second terminal of the switching element 121 from the reference potential 111 to the drive potential 112. As a result of this, the voltage level of the intermediate node 122 may be increased in an efficient and reliable manner.

The control unit 110, 210 may be configured to transfer the control terminal of the switching element 121 from the reference potential 111 to the drive potential 112, to cause a transition from the OFF state to the ON state of the switching element 121. As a result of this, the capacitance of the capacitor circuit 100 may be switched to the ON-state capacitance.

Hence, the control unit 110, 210 may be configured to set the switching element 121 to the ON state to provide the ON-state capacitance at the capacitor node CAP, or to set the switching element 121 to the OFF state to provide the OFF-state capacitance at the capacitor node CAP, which is different from the ON-state capacitance. The ON-state capacitance may correspond to the capacitance C1 of the further capacitor element 123. The OFF-state capacitance may correspond to the capacitance of the serial arrangement of the further capacitor element 123 and the capacitor element 124.

The control unit 110, 210 may comprise an inverter that is configured to generate an effective drive signal 216 based on an inverted drive signal 215. The effective drive signal 216 may be at the drive potential 112 when the inverted drive signal 215 is at the reference potential 111. Furthermore, the effective drive signal 216 may be at the reference potential 111 when the inverted drive signal 215 is at the drive potential 112. The effective drive signal 216 may be applied to the control terminal of the switching element 121 for causing the switching element 121 to transition from the ON state to the OFF state, or from the OFF state to the ON state. For this purpose, the control terminal may be (directly) coupled to the output of the inverter. The inverted drive signal 215 may be applied to the second terminal of the switching element 121. For this purpose, the second terminal may be (directly) coupled to the input of the inverter.

The inverter may exhibit a predetermined delay, such that the effective drive signal 216 transitions from the drive potential 112 to the reference potential 111 at the predetermined delay after the inverted drive signal 215 transitions from the reference potential 111 to the drive potential 112. The duration of the bias interval may depend on, in particular may be equal to, the predetermined delay of the inverter.

By making use of an inverter, the charge transfer to the intermediate node 122 may be performed in a particularly efficient and reliable manner.

The control unit 110, 210 may further comprise a drive unit 110 configured to generate a drive signal 116 based on the digital control signal 115. Furthermore, the control unit 110, 210 may comprise an inverter unit 210 comprising a first inverter configured to generate the inverted drive signal 215 based on the drive signal 116 and also comprising the inverter that is configured to generate the effective drive signal 216 based on the inverted drive signal 215. Hence, a particularly efficient and reliable control unit 110, 210 may be provided.

Furthermore, an oscillator circuit configured to oscillate at a plurality of different frequencies is described (e.g., for use within a transmission unit of a portable electronic device). The oscillator circuit comprises the capacitor circuit 100 which is described herein and which is configured to provide different capacitances during the ON state and the OFF state of the switching element 121 of the capacitor circuit 100, to cause the oscillator circuit to oscillate at different frequencies.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. A capacitor circuit comprising:
a capacitor element that is arranged between an intermediate node and a reference potential;
a switching element which comprises a first terminal that is coupled to the intermediate node and a second terminal that is coupled to the reference potential during an ON state of the switching element; wherein the switching element is configured to be switched between the ON state and an OFF state; wherein the switching element exhibits an on-resistance between the first terminal and the second terminal during the ON state and an off-resistance between the first terminal and the second terminal during the OFF state; wherein the off-resistance is higher than the on-resistance; and
a control unit which is configured to:
cause a transition from the ON state to the OFF state of the switching element at a switching time instant; and
within a bias interval that is prior to the switching time instant, transfer an electrical charge to the intermediate node, which is adapted to at least partially compensate an electrical charge that is transferred to the intermediate node during the transition from the ON state to the OFF state of the switching element.

2. The capacitor circuit of claim 1, wherein the control unit is configured to:
transfer a control terminal of the switching element from a drive potential to the reference potential at the switching time instant, to cause the transition from the ON state to the OFF state of the switching element; and
within the bias interval prior to the switching time instant, charge the intermediate node to a voltage level that lies between the reference potential and the drive potential or that is equal to the drive potential.

3. The capacitor circuit of claim 2, wherein:
the drive potential is higher than the reference potential; and
the control unit is configured, within the bias interval prior to the switching time instant, to increase a voltage at the intermediate node to a voltage level which is:
higher than the reference potential; and
at or below the drive potential.

4. The capacitor circuit of claim 1, wherein the control unit is configured, within the bias interval prior to the switching time instant, to transfer the second terminal of the switching element from the reference potential to a drive potential.

5. The capacitor circuit of claim 1, wherein:
the bias interval immediately precedes the switching time instant; and
the transition of the switching element from the ON state to the OFF state is accomplished within a transition time, and the bias interval has a duration that is two times the transition time or less.

6. The capacitor circuit of claim 1, wherein the control unit is configured to transfer a control terminal of the switching element from the reference potential to a drive potential, to cause a transition from the OFF state to the ON state of the switching element.

7. The capacitor circuit of claim 1, wherein:
the control unit comprises an inverter that is configured to generate an effective drive signal based on an inverted drive signal, such that the effective drive signal is at a drive potential when the inverted drive signal is at the reference potential; and the effective drive signal is at the reference potential when the inverted drive signal is at the drive potential;

the effective drive signal is applied to a control terminal of the switching element for causing the switching element to transition from the ON state to the OFF state, or from the OFF state to the ON state; and the inverted drive signal is applied to the second terminal of the switching element.

8. The capacitor circuit of claim 7, wherein:

the inverter exhibits a predetermined delay, such that the effective drive signal transitions from the drive potential to the reference potential at the predetermined delay after the inverted drive signal transitions from the reference potential to the drive potential; and a duration of the bias interval depends on, in particular is equal to, the predetermined delay of the inverter.

9. The capacitor circuit of claim 7, wherein the control unit comprises:

a drive unit configured to generate a drive signal based on a digital control signal; and an inverter unit comprising:

a first inverter configured to generate the inverted drive signal based on the drive signal; and the inverter that is configured to generate the effective drive signal based on the inverted drive signal.

10. The capacitor circuit of claim 1, wherein:

the capacitor circuit comprises a further capacitor element that is arranged between a capacitor node and the intermediate node; and the control unit is configured to:

set the switching element to the ON state to provide an ON-state capacitance at the capacitor node; and set the switching element to the OFF state to provide an OFF-state capacitance at the capacitor node, which is different from the ON-state capacitance.

11. The capacitor circuit of claim 10, wherein the capacitor circuit is configured such that:

the ON-state capacitance corresponds to a capacitance of the further capacitor element; and the OFF-state capacitance corresponds to a capacitance of a serial arrangement of the further capacitor element and the capacitor element.

12. The capacitor circuit of claim 1, wherein the control unit is configured to:

determine that a capacitance of the capacitor circuit is to be modified; and in reaction to determining that the capacitance of the capacitor circuit is to be modified, cause the switching element to transition from the ON state to the OFF state.

13. The capacitor circuit of claim 1, wherein:

the switching element is a MOS transistor, in particular an n-type or p-type MOS transistor;

the first terminal and the second terminal of the switching element correspond to a source and drain of the MOS transistor; and a control terminal of the switching element corresponds to a gate of the MOS transistor.

14. An oscillator circuit configured to oscillate at a plurality of different frequencies, wherein the oscillator circuit comprises the capacitor circuit of claim 1, which is configured to provide different capacitances during the ON state and the OFF state of the switching element of the capacitor circuit, to cause the oscillator circuit to oscillate at different frequencies.

15. A method for controlling a capacitor circuit, wherein the capacitor circuit comprises:

a capacitor element that is arranged between an intermediate node and a reference potential; and a switching element which comprises a first terminal that is coupled to the intermediate node and a second terminal that is coupled to the reference potential during an ON state of the switching element; wherein the switching element is configured to be switched between the ON state and an OFF state; wherein the switching element exhibits an on-resistance between the first terminal and the second terminal during the ON state and an off-resistance between the first terminal and the second terminal during the OFF state; wherein the off-resistance is higher than the on-resistance; and wherein the method comprises:

determining that a capacitance of the capacitor circuit is to be modified;

in reaction to the determining, transferring an electrical charge to the intermediate node, which is adapted to at least partially compensate for an electrical charge that is transferred to the intermediate node during a transition from the ON state to the OFF state of the switching element; and subsequent to transferring the electrical charge, causing a transition from the ON state to the OFF state of the switching element, to modify the capacitance of the capacitor circuit.

* * * * *